United States Patent
Tsuchiya

(10) Patent No.: US 7,030,029 B2
(45) Date of Patent: Apr. 18, 2006

(54) METHOD OF HIGH SELECTIVITY SAC ETCHING

(75) Inventor: Kazuo Tsuchiya, Hillsboro, OR (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/257,990

(22) PCT Filed: May 10, 2001

(86) PCT No.: PCT/JP01/03897

§ 371 (c)(1),
(2), (4) Date: Oct. 30, 2002

(87) PCT Pub. No.: WO01/86701

PCT Pub. Date: Nov. 15, 2001

(65) Prior Publication Data

US 2003/0127422 A1 Jul. 10, 2003

Related U.S. Application Data

(63) Continuation of application No. 09/569,882, filed on May 12, 2000, now abandoned.

(51) Int. Cl.
*H01L 21/302* (2006.01)

(52) U.S. Cl. .............. 438/714; 438/715; 438/725; 438/723; 438/724; 438/740

(58) Field of Classification Search ............. 438/714, 438/725, 715, 723, 724, 740
See application file for complete search history.

(56) References Cited

U.S. PATENT DOCUMENTS

| | | | |
|---|---|---|---|
| 5,595,627 A | * | 1/1997 | Inazawa et al. ......... 438/715 |
| 5,811,357 A | | 9/1998 | Armacost et al. |
| 6,066,555 A | | 5/2000 | Nulty et al. |
| 6,121,098 A | * | 9/2000 | Strobl ................. 438/301 |
| 6,143,615 A | * | 11/2000 | Roberts ............... 438/382 |
| 6,159,862 A | | 12/2000 | Yamada et al. |
| 6,168,989 B1 | * | 1/2001 | Chiang et al. ......... 438/253 |
| 6,211,092 B1 | * | 4/2001 | Tang et al. ............ 438/719 |
| 6,451,703 B1 | | 9/2002 | Liu et al. |
| 6,465,359 B1 | * | 10/2002 | Yamada et al. ......... 438/706 |
| 2002/0030174 A1 | * | 3/2002 | Yamada et al. ........... 252/1 |

FOREIGN PATENT DOCUMENTS

| | | |
|---|---|---|
| DE | 199 29 239 | 1/2000 |
| EP | 0 726 596 | 8/1996 |
| JP | 11 186229 | 7/1999 |
| JP | 2000 036491 | 2/2000 |
| WO | 99 34419 | 7/1999 |

* cited by examiner

*Primary Examiner*—George A. Goudreau
(74) *Attorney, Agent, or Firm*—Oblon, Spivak, McClelland, Maier & Neustadt, P.C.

(57) ABSTRACT

A method for SAC etching is provided involving a) etching a Si wafer having a nitride present thereon with a first etching gas containing a first perfluorocarbon and carbon monoxide, and b) etching the resultant Si wafer having an initially etched nitride photoresist thereon with a second etching gas containing a second perfluorocarbon in the substantial absence of carbon monoxide, wherein the etching steps a) and b) are performed at high RF power and low pressure compared to conventional processes to provide higher selectivity etching and a larger process window for SAC etching, as well as the ability to perform SAC etching and island contact etching under the same conditions with high verticality of the island contact and SAC walls.

30 Claims, 5 Drawing Sheets

METHOD OF HIGH SELECTIVITY SAC ETCHING

TECHNICAL FILED

The present invention provides a method for providing high selectivity in self-aligned contact (SAC) etching by use of a high ion energy plasma generated with high RF power at low process pressure.

BACKGROUND ART

Self-aligned Contact (SAC) is one of the key technologies in ULSI (Ultra Large Scale Integration) fabrication. SAC can relax the alignment margin in photolithography. The selectivity to SiN at the corner (shoulder) is the most important issue in SAC etching.

Therefore, over the years of process development in SAC etching, heavy polymerization chemistries have been relied on in order to get high selectivity to nitride (i.e. ratio of [oxide etch rate]/[nitride etch rate]), because the nitride corner is exposed to plasma for a longer time or a longer over-etching than the bottom nitride. For achieving high corner selectivity, gases having high C/F atomic ratio, such as $C_4F_8$, are used in SAC etching. Additionally, $CH_3F$ or $CH_2F_2$ addition is reported to increase corner selectivity. Unfortunately, high selectivity SAC etching with these gases is also accompanied by the etch stop phenomenon, where the etching is incomplete, stopping in the middle of the hole due to fast polymerization, particularly in narrow slits between the gate electrodes. The width of the slit will be narrower with the shrinkage of the minimum feature sizes in LSIs. Thus it is becoming ever more difficult to keep the corner selectivity without encountering etch stop in the slit.

On the other hand, while the nitride corner is exposed, oxide in a narrow slit between the gate electrode is continuously being etched and oxygen is released which slows down the polymer formation on the nitride corner. It is also known that there is usually observed a lower selective portion on the small overlapped nitride corner and at the worst case, this phenomenon causes an electrical short problem.

The etch stop phenomenon is particularly a problem when the etching parameters must be controlled in a narrow process window. This requires very close control of etching parameters. On the other hand, the superior and strong carbon rich polymerization often cases various other problems such as an etching profile micro loading between dense and isolated patterns, a slow etching rate, low throughput and short mean time between wet cleanings (MTBWC).

Conventionally, it has been essential to separate island contact etching on a peripheral area or gate contact etching processes from SAC etching because it is very difficult to get a vertical profile and maintain enough good contact resistance when etched at the same time or with the same process due to superior and strong carbon rich polymerization.

One conventional method for SAC etching employs dipole ring magnetron reactive ion etching (DRMRIE). In DRMRIE, the plasma ion density is considered medium density and is from $10^{10}$–$10^{11}$ ions/cm$^3$. This provides a very stable, repeatable plasma with high selectivity. Unfortunately, the conventional use suffers from a low etching rate and tends to leave the corners from the etching process too sharp. Conventional etching uses a plasma generated using a pressure of from 50–60 mT and an RF power of 1300–1500 W.

Additionally, in conventional etching processes, the way to achieve higher selectivity is considered to be by increasing the bottom temperature (temperature at the bottom of the layer being etched) and to reduce the power. Unfortunately, these two procedures tend to cause etch stopping, described above.

Table 1 below provides a summary of various issues present in the SAC etching process conventionally practiced.

TABLE 1

Table of various process issues/requirements of SAC etching

| Process Issues | Requirements on process integration around SAC etch | Requirements on SAC etching process |
|---|---|---|
| (1) Current leakage between W-plug and Inter-connect line | To minimize the misalignment of the Inter-connect line | To control the etch CD-bias on top of the contact hole |
| (2) Incomplete etching down to the Si substrate | to optimize the cell layout to have enough contact space | To have enough big etching capability |
| (3) Electrical short between W-plug and Poly Gate | To optimize the thickness and materials of the Gate Cap/Spacer, To control the overlap amount as much as possible by the Lithography process | To generate C-rich polymer to obtain high selectivity to the Nitride or SiON |
| (4) Small Bottom CD on the island contact hole if it exists | N/A | To optimize the etching chemistries |
| (5) Etching profile U-loading between dense and isolated areas | N/A | To optimize the etching chemistries |

Accordingly, a process is needed for SAC etching that avoids the etch stop phenomenon, while maintaining high selectivity and high etching rate, with a large process window.

DISCLOSURE OF INVENTION

Accordingly, one object of the present invention is to provide a method for SAC etching that provides high SiO/SiN selectivity while avoiding etch stop.

A further object of the present invention is to provide a method for SAC etching that provides high etch rate and high selectivity within a large process window.

A further object of the present invention is to provide a method for SAC etching that can be performed while simultaneously providing island contact etching with high verticality of the island contact walls.

These and further objects of the present invention have been satisfied by the discovery of a method for SAC etching comprising:
a) etching a wafer having a silicon oxide layer above a silicon nitride layer present thereon with a first etching gas comprising a first perfluorocarbon and carbon monoxide and,
b) etching the resultant wafer having an initially etched silicon nitride thereon with a second etching gas comprising a second perfluorocarbon in the absence of carbon monoxide.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein.

BEST MODE FOR CARRYING OUT OF THE INVENTION

Figure 1:
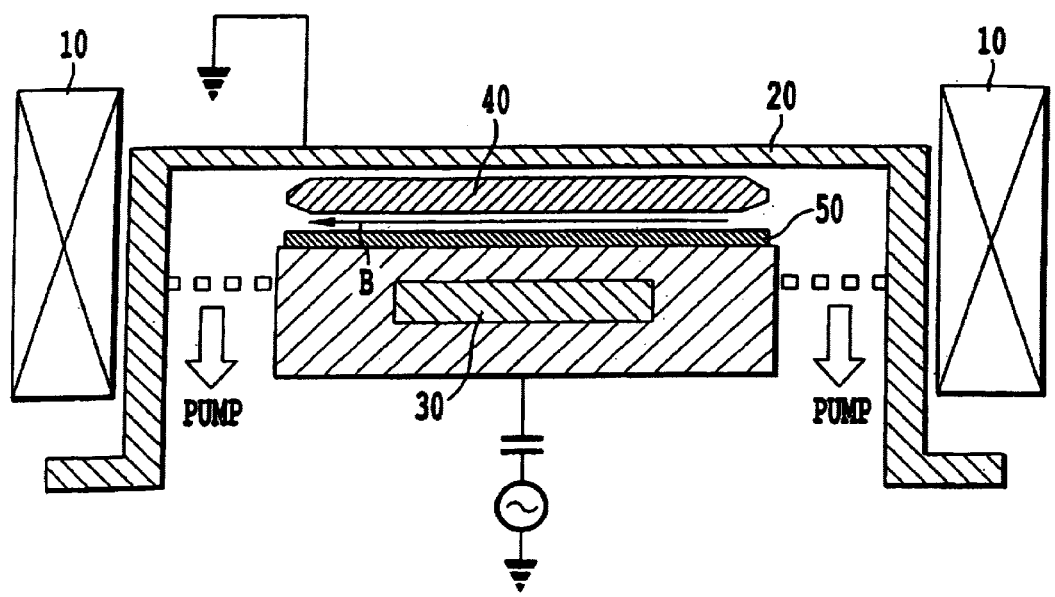
FIG. 1 shows a schematic of a DRMRIE system suitable for use in practicing the present process.

The present invention relates to a method for etching, preferably for preparation of both SAC and vertical island contact, which provides high SiN selectivity with smooth and rounded shape in SAC etching and nearly vertical walls in island contacts. The present process uses a two stage etching process using a high energy plasma generated with high RF power under low pressure.

The two steps of the present process can be generally described as (1) an initial stage using a combination of a perfluorocarbon and carbon monoxide gases, followed by (2) a second stage using a perfluorocarbon gas in the absence of carbon monoxide. The two stages can be performed at the same RF power and pressure or at different RF powers, different pressures, or both.

As the perfluorocarbon (PFC) gas, any conventional perfluorocarbon used for etching can be used. Preferably, the PFC is any of the PFC's having empirical formulae $C_3F_6$, $C_4F_6$, $C_4F_8$ or $C_5F_8$, more preferably of the formulae and structures:

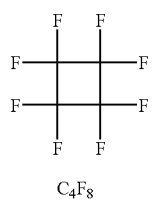

$C_4F_8$

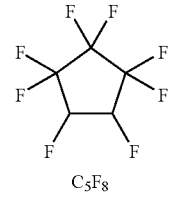

$C_5F_8$ most preferably c-$C_4F_8$.

The first stage of the process of the present invention combines PFC gas and carbon monoxide (CO) gas. Preferably the first stage combines these two gases with an inert gas carrier such as argon, and either oxygen ($O_2$) or nitrogen ($N_2$).

The second stage of the present process uses a similar reaction gas mixture as the first stage, without the presence of carbon monoxide.

The first and second stages can use the same PFC gas or different PFC gases. The first and second stages can be performed in discrete and separate steps with the DRMRIE apparatus being turned off between steps to allow change of the reaction gas atmosphere, or can be connected by a transitional period wherein the DRMRIE apparatus continues operating while the atmosphere is changed and equilibrated, resulting in a transitional stage between the first and second stages of the process.

When performing the present process, any size target can be used, with 8 inch wafers being preferred. In the preferred 8 inch wafer embodiment, the preferred RF power for plasma generation is 1700 watts or more, at a pressure of 30 mTorr or less. Under the conditions of the present invention, the etching rate of TEOS or BPTEOS in the first stage (PFC and CO) is on the order of 6000 Å/min, compared to conventional etch rates of 3800–4000 Å/min.

When using the present invention process for forming island contacts, the present process provides walls that are nearly vertical. For TEOS (oxide layer deposited by plasma-CVD from tetraethoxysilane), the present process provides wall angles of from 87.5–88°, compared to 84–85° for conventional etching (where 90° would be perfectly vertical walls). Regardless of the layer material used, the present process provides significant improvements in wall angle. For example, etching of BPTEOS (TEOS doped with 6 wt % Boron and 4 wt % Phosphate and annealed at 850–950° C.) using the present process gives wall angles of ~88.5°, compared to 87.5° for conventional processes. (In the etching art, as one approaches 90°, each 1° of improvement becomes quite a significant difference.) Similar results are obtained also with AMAT Gigafill, a similar product commercially available from Applied Material and Technology of California.

In the etching gas of the present invention, the inert carrier gas can be any inert gas suitable for plasma etching, preferably Ar, He or Xe, most preferably Ar. The gas mixture can contain either of $O_2$ or $N_2$. When $N_2$ is used, the feed rate of $N_2$ is preferably 10 times higher than the feed rate Of $O_2$ normally used.

The preferred gas feed rates (in standard cubic centimeter, SCCM) for each stage are:

| Stage | PFC | CO | Inert Gas | $O_2$ | ($N_2$) |
|---|---|---|---|---|---|
| 1 | 20–27 | 50–100 | 150–300 | 7–12 | (70–120) |
| 2 | 10–20 | 0 | 450–550 | 5–10 | (50–100) |

Most preferably the gas feed rates are:

| Stage | PFC | CO | Inert Gas | $O_2$ |
|---|---|---|---|---|
| 1 | 25 | 50 | 250 | 10 |
| 2 | 20 | 0 | 500 | 10 |

The PFC/$O_2$ flow ratio is more important in the process than the absolute flow rate. The preferred PFC/$O_2$ flow ratio is from 2:1 to 3:1, particularly where the PFC is $C_4F_8$.

Also important in the process of the present invention is the temperature at the bottom of the wafer. The preferred bottom temperature is from 50–60° C.

The present invention process preferably is performed using a dipole ring magnetron reactive ion etching (DRMRIE) system, depicted in FIG. 1. In one embodiment, there are 32 pieces of dipole magnets 10 each having from 60 to 280 Gauss of magnetic force. These 32 dipole magnets rotate around an aluminum body process chamber 20 at approximately 20 rpm, producing a 120 Gauss averaged magnetic field. This magnetic field enhances the plasma density due to ExB drift. The process chamber (20) is evacuated with a turbo molecular pump (not shown) to produce the desired process pressure. The lower electrode 30 having RF power of 13.56 MHz is equipped with an electrically static chuck for wafer chucking, with backside He gas cooling to control the backside temperature of the wafer 50, to 50–60° C. Reaction process gases are introduced to the etching chamber through the upper electrode (40) gas distribution.

Figure 2:
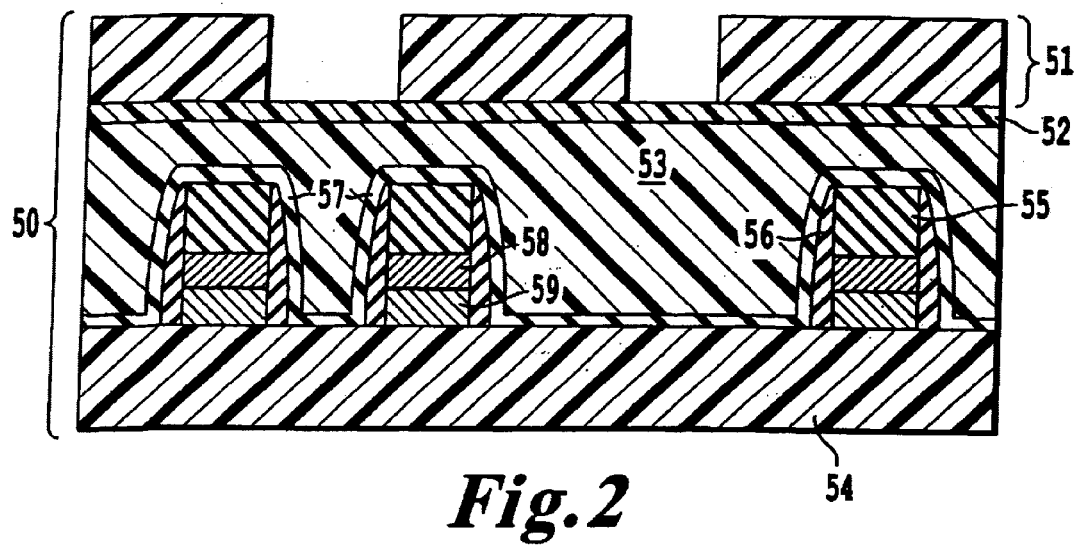
FIG. 2 shows a schematic representation of one embodiment of a wafer to be etched by the present process.
Figure 5:
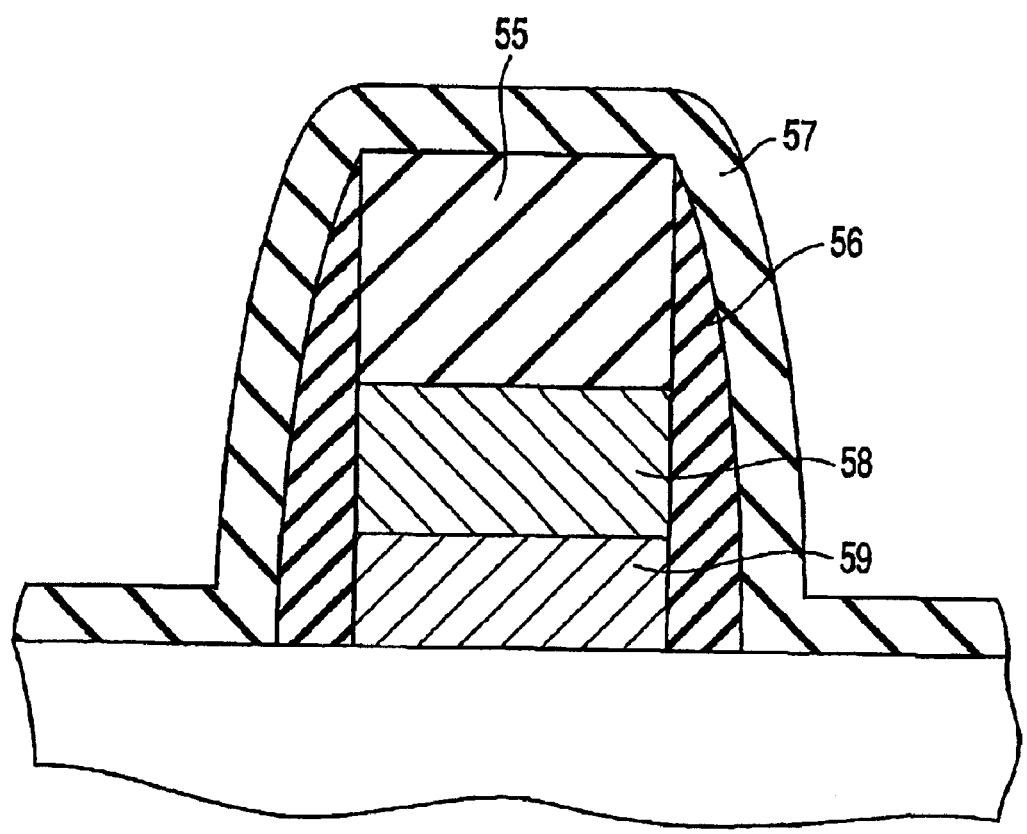
FIG. 5 shows a magnified view of a transistor gate.

FIG. 2 shows a schematic representation of one embodiment of a wafer 50 to be etched by the present process. The test wafer 50 is preferably stacked with 800 nm photoresist (51)/10 nm to 100 nm TEOS (52)/250 nm BPTEOS (53)/poly gate(consisting of the polysilicon (59) and the tungsten silicide (58) as shown in FIG. 5)/Si substrate (54) with 0.20 µm to 0.27 µm hole size. The gate portion comprises a nitride cap (55), with nitride spacers (56) on either side of nitride cap (55), with the assembly surrounded by a nitride liner (57).

The nitride cap can be any nitride material, preferably nitride or nitride/SiON. The thickness of the nitride cap is preferably 200–250 nm, with 230 nm preferred for SiON. The nitride spacers are preferably 60 nm thick and the nitride liner is preferably 30 nm thick.

Figure 3A:
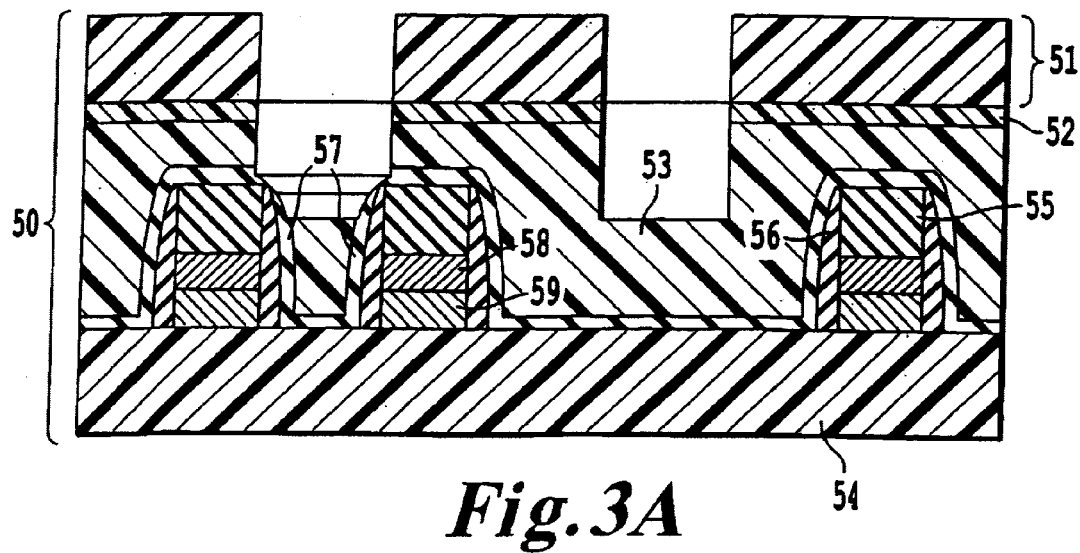
FIG. 3A shows a schematic representation of SAC and island contacts after the descum etch and first etching stage of the present process.

In FIG. 3A, a SAC and an island contact are shown after an initial descum etch and the first etching stage of the present invention process (also called a "break through" etch). In the Figure, the BPTEOS material (53) has been removed down to the corner of the nitride cap (55) and nitride spacer (56), breaking through the nitride liner (57). This etch step is performed to provide etching to a level of 100–1000 Å below the nitride cap corner.

Figure 3B:
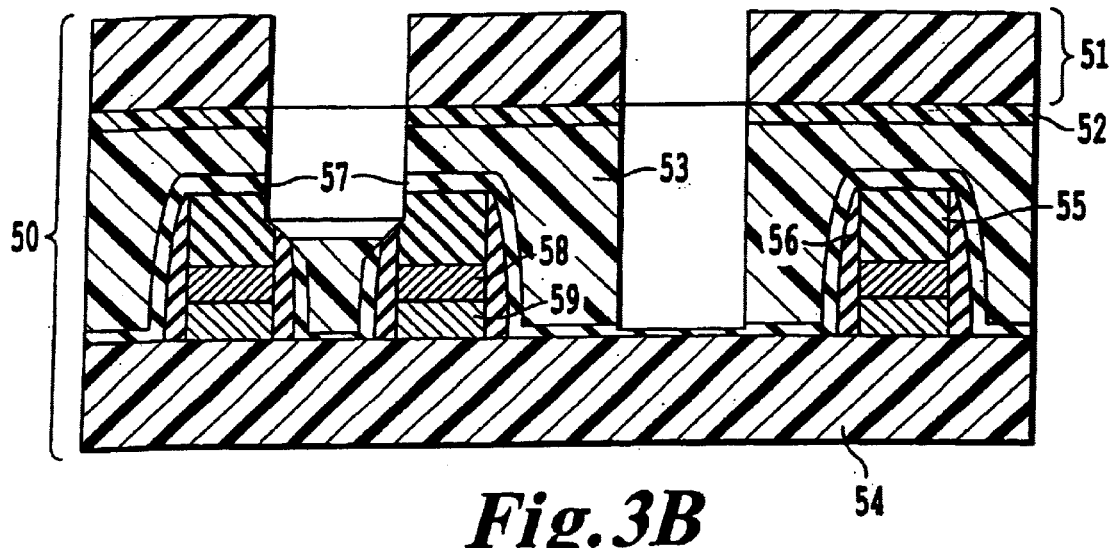
FIG. 3B shows a schematic representation of SAC and island contacts after the second etching stage of the present process.

In FIG. 3B, the process has progressed to after the second etching stage, with approximately 220 Å of target loss at the corner of the nitride cap (55), and with good roundness of corners beginning to show. Nitride liner (57) is still present at the bottom of the etching well in both SAC and island contacts.

Figure 3C:
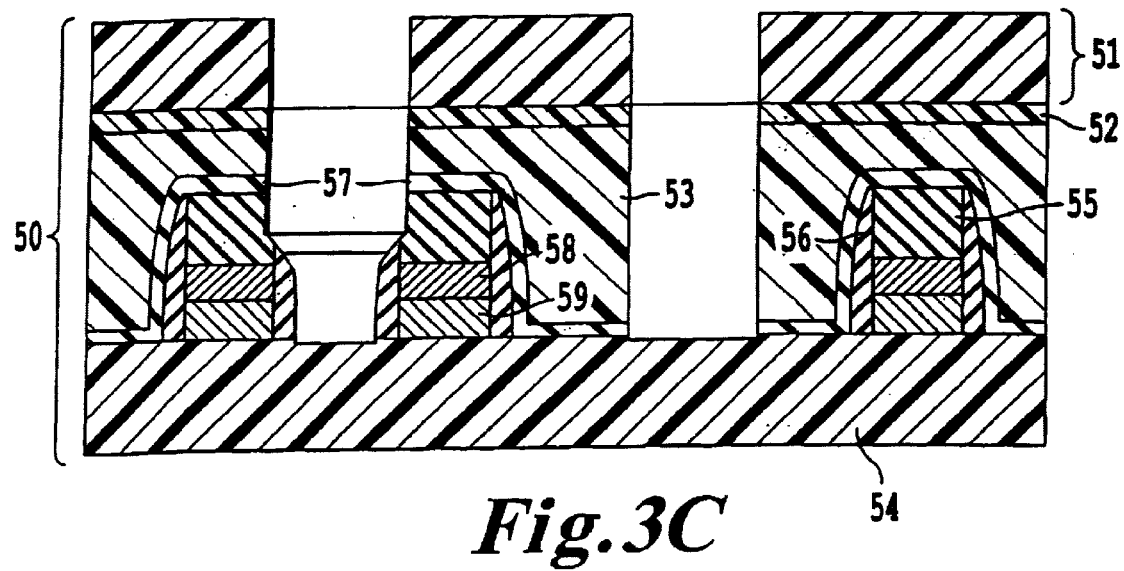
FIG. 3C shows a schematic representation of SAC and island contacts after the final nitride removal step of one embodiment of the present process.

In FIG. 3C, the final nitride removal step has been performed to remove the remaining excess nitride liner (57) from the etching site, with the nitride removal also etching partially into the base support (Si wafer (54)), up to a level of about 200 Å.

Figure 4A:
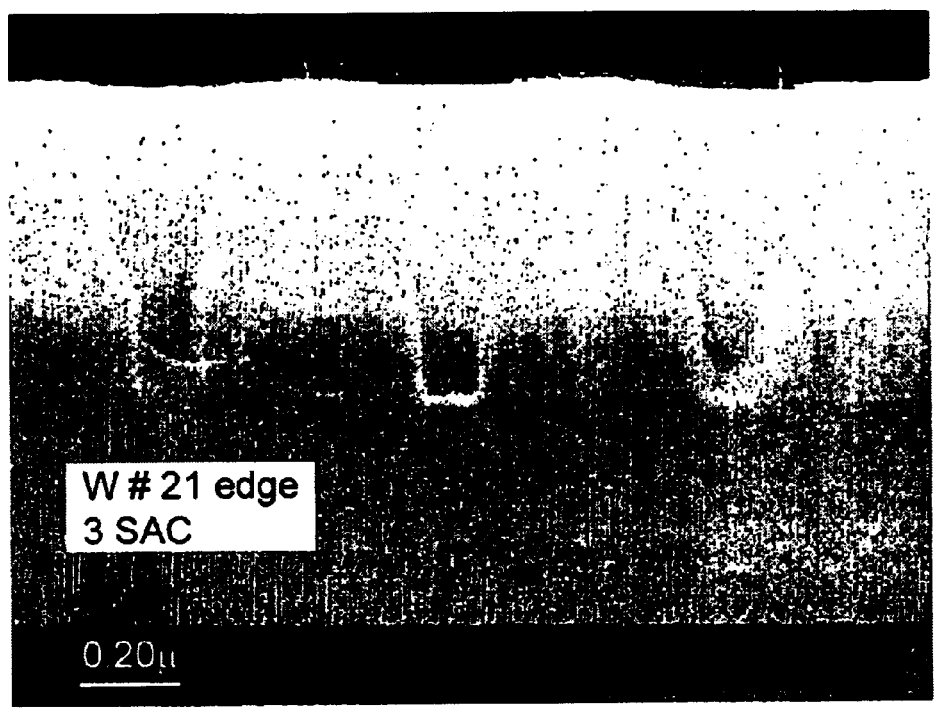
FIGS. 4A and 4B are views for showing electron micrographs of actual etched products clearly illustrating the smooth roundness of the corners and high verticality of the etched walls.
Figure 4B:
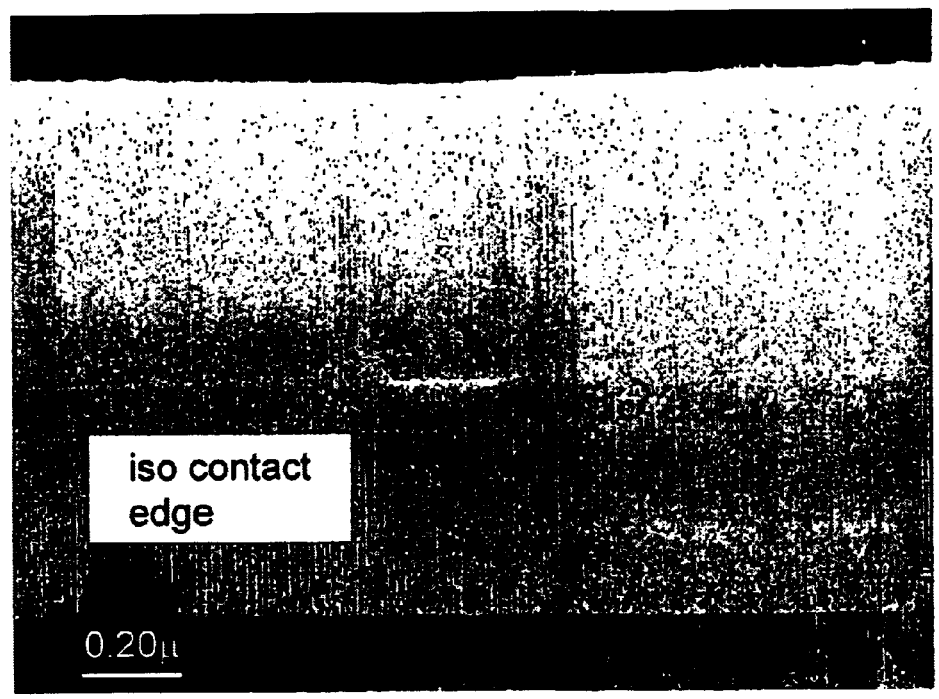

FIGS. 4A and 4B show electron micrographs of actual etched products clearly illustrating the smooth roundness of the corners and high verticality of the etched walls.

The preferred embodiments of the present process start with an initial scum etch step using PCF and $O_2$ (or $N_2$) for 10 seconds or less. This is followed by the two stage etching described above, with a final nitride etch. The first stage etch of the present invention is performed for a time period sufficient to etch to a level of 100–1000 Å below the nitride cap corner (See FIG. 3A). It is preferred to conduct the etching process in both stages, such that a distance of at least 300 Å is maintained between the tungsten silicide corner and the etching front. The distance between the tungsten silicide corner and etching point is more preferably at least 600 Å, most preferably 800–900 Å. In the final product, following both etching stages and final bottom nitride removal, the corner nitride on the poly gate should have 250–350 Å of nitride removed from the above stated thicknesses.

The second stage etch is performed to provide the corners of the nitride with a rounded nature to maintain sufficient distance for the poly gate electrodes. The final nitride etch is performed to complete the process and clean the remaining nitride protective layer off.

The two stage process of the present invention can be used for any type of SAC etching, including but not limited to shallow SAC to deep SAC. Additionally, as noted above, the present process can be used for island contact etching to obtain more nearly vertical walls. One unique aspect of the present process is that it is possible to conduct both SAC etching and island contact etching at the same time using the same conditions, while obtaining outstanding results both in process window for the SAC etching and in wall verticality for the island contact etching.

Use of a single stage PFC process using only a CO combination plasma with high ion energy generated with high RF power and low process pressure, provides a vertical etching profile and solves micro loading between dense and isolated areas, but the etching profile around the corners is too sharp. Depending on the alignment (or misalignment) of the mask, this results in the distance between the poly gate electrodes being not enough to insulate. In order to get a rounded shape on the corners and sufficient distance between the corners of the poly gate electrodes, the present invention uses no CO plasma in the second stage.

Using the present invention two stage process, the conventionally seen carbon rich polymer deposits on the SiN corners, as well as any etching profile micro loading on the end pattern in very isolated areas, do not appear, even with no CO plasma in the second step.

EXAMPLE

Example 1

As a typical example of this invention, one of the etching recipes is described in the following for a high etch rate SAC etching process, with vertical island Contact etching at the same time.

Etching Recipe (1):

Descum Etch: 40 mT 1400 W $CF_4$/AR/$O_2$=80/160/20 sccm, 7 sec

ILD Etch-1: 30 mT 1700 W $C_4F_8$/CO/Ar/$O_2$=25/50/250/10 sccm, 60/60° C. (note in this and the following examples, this represents temp of top electrode and wall/temp of cathode)

Back He C/E=7/30T, 45 sec

ILD Etch-2: 60 mT 1700 W $C_4F_8$/CO/Ar/$O_2$=20/00/500/10 sccm, 60/60° C.

Back He C/E=7/30T, 75 sec

Nitride Etch: 50 mT 800 W $CHF_3$/Ar/$O_2$=10/100/20 sccm, Process Gap=37 mm,

Back He C/E=7/40T, 9 sec

The etch rate of ILD-Etch.1 ($1^{st}$ stage etching) was approximately 1.5 times faster than conventional SAC etching.

Moreover, combined with ILD-Etch.2 ($2^{nd}$ stage etching), the corner etching profile had a smooth and rounded shape. The shortest distance with etching recipe (1) between the corners of the poly gate electrode was approximately 1.5 times longer than that conventional SAC etching recipes after the bottom nitride removal.

In addition to the ILD-1 etching conditions described in etching recipe (1), the etching capability with 10KA TEOS was investigated.

Increasing the gas flow of $C_4F_8$ and $O_2$ while maintaining the same gas ratio, gave up to 1.3 times faster etch rate and could provide a higher etch rate SAC etching simultaneously with vertical island Contact etching with greater than 88° walls at the 0.27 µm hole size, without any etch stop, micro loading or other issues.

In addition, compared with conventional SAC etching, a two step etching approach with $C_4F_8$ chemistries described in etching recipe (1) would expect to extend MTBWC approximately twice and more. Therefore this result not only increases SAC etching process windows but also decreases wafer processing steps, simplifies wafer processing and contributes to cost reduction and yield increase in ULSI fabrication.

The following Tables 2–4 provide process operation ranges for ILD-1, ILD-2 and overall process temperature operation ranges.

TABLE 2

Process Operation Range of 1st Stage of Recipe (1)

| | Press (mT) | RF Power (Watts) | $C_4F_8$ (sccm) | CO (sccm) | Ar (sccm) | $O_2$ (sccm) | Gap (mm) |
|---|---|---|---|---|---|---|---|
| Preferred | 30 | 1700 | 24 | 50 | 200 | 10 | 27 |
| Low | 25 | 1700 | 20 | 50 | 150 | 7 | 27 |
| High | 30 | 2000 | 27 | 100 | 300 | 12 | 47 |

TABLE 3

Process Operation Range of 2nd Stage of Recipe (1)

| | Press (mT) | RF Power (Watts) | $C_4F_8$ (sccm) | CO (sccm) | Ar (sccm) | $O_2$ (sccm) | Gap (mm) |
|---|---|---|---|---|---|---|---|
| Preferred | 60 | 1700 | 10 | 0 | 500 | 5 | 27 |
| Low | 50 | 1700 | 10 | 0 | 450 | 5 | 27 |
| High | 60 | 2000 | 20 | 0 | 600 | 10 | 47 |

TABLE 4

Process Temperature Operation Range of Recipe (1)

| | Top & Wall Temp (deg C.) | Bottom Temp (deg C.) | C-back Side He (Torr) | E-back side He (Torr) |
|---|---|---|---|---|
| Preferred | 60 | 60 | 7 | 40 |
| Low | 50 | 50 | 5 | 30 |
| High | 70 | 80 | 10 | 50 |

Example 2

Highly selective SAC etching technique with the vertical island Contact etching at the same time
Etching Recipe (2):
Descum Etch: 40 mT 1400 W $CF_4/Ar/O_2$=80/160/20 sccm, 7 sec
ILD Etch-1: 50 mT 1700 W $C_5F_8/CO/Ar/O_2$= 10/150/480/6 sccm, 60/60° C.,
  Back He C/E=7/40T, 122 sec
I LD Etch-2: 50 mT 1500 W
  $C_5F_8/CO/Ar/O_2$=6/00/500/6 sccm, 60/60° C.
  Back He C/E=7/40T, 70 sec
Nitride Etch: 50 mT 800 W $CHF_3/Ar/O_2$=10/100/20 sccm, 60/60° C., Back He C/E=7/40T, 9 sec,
  Process Gap=37 mm Etching Recipe (2) includes $C_5F_8$ chemistries, which is more selective to SiN than $C_4F_8$, due to the higher C/F atomic-ratio, and could generate more carbon rich polymerization. However etching recipe (2) described above achieved vertical contact profile all over the wafer with greater than 87° walls at the 0.27 µm hole size.

Conventional highly selective SAC etching with $C_5F_8$ chemistries give slightly tapered profiles with around 82–84° at the 0.27 µm hole size. So the contact resistance would be extremely improved in the present invention, giving much improved device function with the present invention approach described above.

In the SAC portion profile, the shortest distance with etching recipe (2) between the poly gate electrode corners ensured a margin approximately 2.0 times longer than that of conventional SAC etching recipes after the bottom nitride removal. Additionally, in this Example 2 recipe, the resulting nitride corner was greater than 620 Å all over the wafer.

Resulting from a study of the dissociation state of $C_5F_8$ based on enthalpies delta-H, it is already known that $C_5F_8$ is mainly dissociated into CF and $CF_2$ radicals and produces more carbon rich element in the plasma (3). Moreover it has been known widely that the fluorocarbon radicals react with CO to reduce fluorine from the bulk plasma (4).

The $C_5F_8$ chemistries described in etching recipe (2) gave optimized polymerization for the highly selective SAC etching and the reaction with CO in the bulk plasma gave more carbon rich radicals, such as CF and $CF_2$, and provided the highly selective SAC etching with the vertical island Contact etching at the same time.

The $C_5F_8$ chemistries described in etching recipe (2) result in a small slit between gate electrodes, having a minimum bottom dimension of 0.05 µm, without any etch stop due to the optimized polymerization and the effect of the reaction with CO. The process of the invention not only increased the process margins but also the process capability for future SAC schemes.

In addition, compared with conventional SAC etching, the present two stage etching approach with $C_5F_8$ chemistries described in etching recipe (2) would extend MTBC approximately twice and more.

Example 3

Highly selective and high etch rate SAC etching technique with the vertical island Contact etching at the same time
Etching Recipe (3):
Descum Etch: 40 mT 1400 W $CF_4/Ar/O_2$=80/160/20 sccm, 7 sec
ILD Etch-1: 30 mT 1700 W
  $C_4F_8/CO/Ar/O_2$=25/50/250/10 sccm,
  60/60° C.,
  Back He C/E=7/30T, 45 sec
ILD Etch-2: 50 mT 1500 W $C_5F_8/CO/Ar/O_2$=10/00/500/10 sccm, 60/60° C.
  Back He C/E=7/30T, 90 sec
Nitride Etch: 50 mT 800 W $CHF_3/Ar/O_2$=10/100/20 sccm,
  Process Gap=37 mm,
  Back He C/E=7/40T, 9 sec This example combined the benefits of $C_4F_8$ chemistry in Example 1 with the benefits of $C_5H_8$ chemistry in Example 2 and gave highly selective and high etch rate SAC etching with the vertical island Contact etching at the same time.

So Etching recipe (3) would be one example of the ultimate SAC etching technique to have a total solution for current ULSI fabrication.

Further etching recipes are provided below. These recipes could maintain about 700 from the corner of the poly gate, which is approximately 2.0 times longer than conventional SAC processes.

Etching Recipe (4):
Descum Etch: 40 mT 1400 W $CF_4$/Ar/$O_2$=
  80/160/20 sccm, 7 sec
$1^{st}$ Stage: 30 mT 1700 W $C_4F_8$/CO/Ar/$O_2$=
  20/50/250/10 sccm
  Back He C/E=10/40T, 45 sec
$2^{nd}$ Stage: 45 mT 1800 W $C_5F_8$/CO/Ar/$O_2$=
  10/00/500/10 sccm,
  Back He C/E=10/40T, 85 sec
Nitride Etch: 50 mT 800 W $CHF_3$/Ar/$O_2$=
  10/100/20 sccm, Process Gap 37 mm,
  Back He C/E=7/40T, 12 sec
Etching Recipe (5):
  Descum Etch: 40 mT 1400 W $CF_4$/Ar/$O_2$=80/160/20
    sccm,
    7 sec
  $1^{st}$ Stage: 30 mT 1700 W $C_4F_8$/CO/Ar/$O_2$=
    20/50/250/10 sccm
    Back He C/E=10/40T, 45 sec
  $2^{nd}$ Stage: 45 mT 1800 W $C_5F_8$/CO/Ar/$O_2$/$CF_4$=
    15/00/500/15/10 sccm,
    Back He C/E=10/40T, 75 sec
  Nitride Etch: 50 mT 800 W $CHF_3$/Ar/$O_2$=10/100/20 sccm,
    Process Gap=37 mm,
    Back He C/E=7/40T, 12 sec

TABLE 5

Process Operation Range of $2^{nd}$ Stage of Recipe (3), (4) and (5)

| | Press. (mT) | RF Power (Watts) | $C_5F_8$ (sccm) | CO (sccm) | Ar (sccm) | $O_2$ (sccm) | $CF_4$ (sccm) | Gap (mm) |
|---|---|---|---|---|---|---|---|---|
| Preferred | 45 | 1800 | 15 | 0 | 500 | 15 | 10 | 27 |
| Low | 40 | 1500 | 6 | 0 | 400 | 5 | 0 | 27 |
| High | 50 | 2000 | 20 | 0 | 600 | 20 | 10 | 47 |

TABLE 6

Process Temperature Operation Range of Recipe (3), (4) and (5)

| | Top & Wall Temp (deg C.) | Bottom Temp (deg C.) | C-back Side He (Torr) | E-back side He (Torr) |
|---|---|---|---|---|
| Preferred | 60 | 60 | 7 | 40 |
| Low | 50 | 50 | 5 | 30 |
| High | 70 | 80 | 10 | 50 |

Simply increased gas flow rate of $C_5F_8$ and $O_2$ while maintaining the same ratio as the $2^{nd}$ stage of Recipe (3) resulted in the etch stop phenomena beginning in a narrow slit, especially when the gas ratio of $C_5F_8$+$O_2$/Ar was bigger than 5%, regardless of the fact that the oxide etch rate and selectivity to nitride both increase. In order to eliminate the etch stop issue in higher gas flow ranges or higher gas ratios, it was sufficient to mix one more gas (at least) which could generate $CF_3$+ ion easily, such as $CF_4$, $C_2F_6$ and $C_3F_8$. Thus, SAC etching using a recipe such as Recipe (5) could be performed sucessfully without etch stop. The etching rate of the $2^{nd}$ stage of Recipe 5 was approximately 6000 Å/min on a TEOS wafer, which was approximately twice faster than that with a conventional SAC etching recipe.

Etching recipes using $C_4F_6$, which is a more carbon-rich chemistry compared to $C_5F_8$, are the same as above, with $C_4F_6$ substituted for $C_5F_8$.

Wafers were obtained having the following properties: (thickness is given in the unit of A (angstrom)) $C_5F_8$ process:
Wafer 11—45 mT/1800 W/10 $C_5F_8$/500 Ar/10 $O_2$/60 deg C. Btm/85 sec
  Result: Center 780–860 (2 sac), 730–840 (3 sac) Edge 700–840 (2 sac), 700–840 (3 sac)
Wafer 5—45 mT/1800 W/11 $C_5F_8$/500 Ar/9 $O_2$/60 deg C. Btm/85 sec
  Result: Center 810–930 (2 sac), 760–930 (3 sac) Edge 970–1190 (2 sac), 910–1050 (3 sac)
Wafer 6—45 mT/1800 W/9 $C_5F_8$/500 Ar/11 $O_2$/60 deg C. Btm/85 sec
  Result: Center 650–690 (2 sac), 690–740 (3 sac) Edge 700–750 (2 sac), 690–750 (3 sac)
Wafer 9—45 mT/1800 W/15 $C_5F_8$/500 Ar/15 $O_2$/10 $CF_4$/60 deg C. Btm/75 sec
  Result: Center 710–780 (2 sac), 700–780 (3 sac) Edge 900–1130 (2 sac), 820–910 (3 sac)
Wafer 8—45 mT/1800 W/12 $C_5F_8$/500 Ar/8 $O_2$/60 deg C. Btm/85 sec
  Result: Etch Stop
$C_4F_6$ Process:
Wafer 12—45 mT/1800 W/10 $C_4F_6$/500 Ar/10 $O_2$/60 deg C. Btm/85 sec
  Result: Center 740–780 (2 sac), 720–820 (3 sac) Edge 760–920 (2 sac), 730–910 (3 sac)
Wafer 1—45 mT/1800 W/11 $C_4F_6$/500 Ar/9 $O_2$/60 deg C. Btm/85 sec
  Result: Center 740–850 (2 sac), 730–900 (3 sac) Edge 820–950 (2 sac), 720–1080 (3 sac)
Wafer 2—45 mT/1800 W/9 $C_4F_6$/500 Ar/11 $O_2$/60 deg C. Btm/85 sec
  Result: Center 700–800 (2 sac), 700–850 (3 sac) Edge 700–770 (2 sac), 700–780 (3 sac)
Wafer 3—45 mT/1800 W/11 $C_4F_6$/500 Ar/11 $O_2$/60 deg C. Btm/85 sec
  Result: Center 890–900 (2 sac), 760–860 (3 sac) Edge 970–1000 (2 sac), 740–1010 (3 sac)
Wafer 4—45 mT/1800 W/15 $C_4F_6$/500 Ar/15 $O_2$/10 $CF_4$/60 deg C. Btm/75 sec
  Result: Center 740–860 (2 sac), 770–840 (3 sac) Edge 910–1020 (2 sac), 740–1010 (3 sac)
Wafer 7—45 mT/1800 W/12 $C_4F_6$/500 Ar/8 $O_2$/60 deg C. Btm/85 sec
  Result: Etch Stop The data obtained according to the present invention provide the following conclusions:
For $C_5F_8$ Chemistries:
  1. The gas ratio of $CsF_8$/$O_2$ is most preferably between 0.818 and 1.222.
  2. The gas ratio of $C_5F_8$+$O_2$/Ar is preferably between 0.02 and 0.05, more preferably between 0.03 and 0.04.
For $C_4F_6$ Chemistries:
  1. The gas ratio of $C_4F_6$/$O_2$ is most preferably between 0.818 and 1.222.

2. The gas ratio of $C_4F_6+O_2/Ar$ is preferably between 0.02 and 0.05, more preferably between 0.03 and 0.04.

3. As noted above for the case of $C_5F_8$ chemistries, when the gas ratio of $C_4F_6+O_2/Ar$ is greater than 0.05, additional gas is required such as $CF_4$, $C_2F_6$, $C_3F_8$ or $C_4F_{10}$ ($CnF_{2n+2}$).

Since there is not a big difference seen between recipes using $C_4F_6$ and those using $C_5F_8$, either recipe would be an example of a SAC etching technique to have a total solution for current ULSI fabrication. These etching recipes could also be applied to other processes such as Via contact process or Dual Damascene process.

As device integration increases and device feature size is reduced, it gets more difficult to fill insulating material in the small slit between gate electrodes for SAC scheme. Also it is known that interconnect delay caused by wiring capacitance increases drastically and degrades circuit performance of LSIs.

In order to address these issues for the next generation SAC scheme, it is expected to apply SOG films having as the main ingredients, SiOH or SiOF.

For a new SAC scheme, a PFC and CO combination plasma described in ILD-1 step of the above etching recipes or no CO combination plasma described in ILD-2 step of the above etching recipes can etch SOG films same as the conventional oxides.

Additionally, by replacing the $O_2$ with $N_2$, these two step etching approaches can realize the same timing etching technique of SAC and Contact etching for the conventional oxide scheme and new materials as the main ingredients of SiOH or SiOF.

Therefore, the method of the present invention is useful and advances SAC etching technology in ULSI fabrication since the etching rate of SOG film is almost the same as that of conventional oxide films such as PSG, NSG, TEOS and Thermally-grown-$SiO_2$.

And there sometimes happens process issues on CMP process step. Therefore the film stack of a wafer (50) is not always exactly same. In case of FIG. 2., TEOS (52) underneath of Photoresist may have some film variation on wafer-to-wafer. And then if a film variation on wafer-to-wafer exists much on incoming material, SAC etching could be controlled by End Point Detection System to eliminate any mistakes on etch process.

For the 1st stage etching, C—$F_2$ radical (260 nm) and C—N radical (387 nm) spectra are very useful to detect 1st endpoint for Nitride liner (57) on Nitride cap (55) in case of CO contained plasma. And for the 2nd stage etching, C—$F_2$ radical (260 nm) and C—O radical (219 nm) are very useful to detect 2nd endpoint for the Bottom Nitride liner (57). Moreover while etching oxide films, C—O is produced as by-product, so no-CO plasma as in $2^{nd}$ stage etching recipe in this present invention, would have another advantage to detect end point much easier.

Alternative optical emission spectra are described in the followings;

| | |
|---|---|
| CF | 240 nm, 256 nm, |
| $CF_2$ | 252 nm, 255 nm, 263 nm, 271 nm, 275 nm |
| CO | 239 nm, 249 nm, 283 nm, 313 nm, 331 nm, 349 nm, 370 nm, 451 nm, 484 nm, 520 nm, 561 nm |
| CN | 359 nm, 418 nm, 422 nm, 647 nm, 693 nm, 709 nm, 785 nm |

What is claimed is:

1. A method for SAC etching comprising:
   a) etching a silicon oxide layer above a silicon nitride layer present thereon with a first etching gas comprising a first perfluorocarbon and carbon monoxide to etch through the silicon oxide layer, and
   b) etching the silicon nitride layer with a second etching gas comprising a second perfluorocarbon in the absence of carbon monoxide,
   wherein the silicon nitride layer under the etched silicon oxide layer is not etched through.

2. The method of claim 1, wherein said step a) and step b) are each performed at a plasma producing RF power of greater than 1500 W and at a pressure of 50 mTorr or less.

3. The method of claim 1, wherein said step a) is performed at a plasma producing RF power of at least 1700 W and at a pressure of 30 mTorr or less.

4. The method of claim 1, wherein said step b) is performed at a plasma producing RF power of at least 1700 W and at a pressure of 30 mTorr or less.

5. The method of claim 3, wherein said step b) is performed at a plasma producing RF power of at least 1500 W and at a pressure of 50 mTorr or less.

6. The method of claim 1, wherein said step a) is performed at a plasma producing RF power and pressure sufficient to generate an etching rate of at least about 6000 Å/min.

7. The method of claim 1, wherein said first perfluorocarbon and said second perfluorocarbon are the same.

8. The method of claim 1, wherein said first perfluorocarbon and said second perfluorocarbon are different from one another.

9. The method of claim 1, wherein said first perfluorocarbon is $C_3F_6$, $C_4F_6$, $C_4F_8$ or $C_5F_8$.

10. The method of claim 1, wherein said second perfluorocarbon is $C_3F_6$, $C_4F_6$, $C_4F_8$ or $C_5F_8$.

11. The method of claim 9, wherein said first perfluorocarbon is $C_4F_8$ or $C_5F_8$.

12. The method of claim 10, wherein said second perfluorocarbon is $C_4F_8$ or $C_5F_8$.

13. The method of claim 1, wherein said method further comprises:
   descumming prior to said step a), wherein said descumming is performed with an etch gas of a third perfluorocarbon and either of $O_2$ or $N_2$ for a period of 10 seconds or less, wherein said third perfluorocarbon can be the same or different from either of said first or second perfluorocarbons.

14. The method of claim 1, wherein said method further comprises:
   removing nitride in a final nitride etch, wherein said final nitride etch is performed after said step b) for a time period sufficient to remove excess nitride and etch into the Si wafer to a level of up to about 200 Å.

15. The method of claim 1, wherein said first etching gas comprises said first perfluorocarbon and carbon monoxide and further comprises an inert gas and a gas selected from the group consisting of $O_2$ and $N_2$.

16. The method of claim 15, wherein said first etching gas is a mixture of 20–27 sccm of said first perfluorocarbon, 50–100 sccm of CO, 150–300 sccm of said inert gas and 7–12 sccm of $O_2$.

17. The method of claim 15, wherein said first etching gas is a mixture of 20–27 sccm of said first perfluorocarbon, 50–100 sccm of CO, 150–300 sccm of said inert gas and 70–120 sccm of $N_2$.

18. The method of claim 1, wherein said second etching gas comprises said second perfluorocarbon, and further comprises an inert gas and a gas selected from the group consisting of $O_2$ and $N_2$, in the substantial absence of carbon monoxide.

19. The method of claim 18, wherein said second etching gas comprises a mixture of 10–20 sccm of said second perfluorocarbon, 450–550 sccm of said inert gas and 5–10 sccm of $O_2$.

20. The method of claim 18, wherein said second etching gas comprises a mixture of 10–20 sccm of said second perfluorocarbon, 450–550 sccm of said inert gas and 50–100 sccm of $N_2$.

21. The method of claim 15, wherein said first etching gas comprises said first perfluorocarbon and $O_2$ in a flow ratio of from 2:1 to 3:1.

22. The method of claim 18, wherein said second etching gas comprises said second perfluorocarbon and $O_2$ in a flow ratio of from 2:1 to 3:1.

23. The method of claim 1, wherein said wafer is maintained at a bottom temperature of from 50–60° C. throughout step a), step b) or both.

24. The method of claim 1, wherein said first perfluorocarbon comprises $C_5F_8$ and at least one of $C_3F_6$, $C_4F_6$ or $C_4F_8$.

25. The method of claim 1, wherein said second perfluorocarbon comprises $C_5F_8$ and at least one of $C_3F_6$, $C_4F_6$ or $C_4F_8$.

26. The method of claim 1, wherein said first perfluorocarbon comprises $C_5F_8$.

27. The method of claim 1, wherein said second perfluorocarbon comprises $C_5F_8$.

28. The method of claim 1, wherein both SAC etching and island contact etching are carried out at the same time under the same conditions.

29. The method of claim 1, further comprising:

detecting an end point for step a) by detecting at least one of a C—$F_2$ radical or a C—N radical, and detecting a second end point in step b) by detecting at least one of a C—$F_2$ radical or C—O radical.

30. The method of claim 1, wherein the step a) etching partially etches the silicon nitride layer.

* * * * *